US005187684A

United States Patent [19]

Hoshino

[11] Patent Number: 5,187,684

[45] Date of Patent: Feb. 16, 1993

[54] SEMICONDUCTOR MEMORY DEVICE WITH READ/WRITE CONTROLLING UNIT FOR CONCURRENTLY WRITING A DATA BIT INTO MEMORY CELLS

[75] Inventor: Yasuharu Hoshino, Tokyo, Japan

[73] Assignee: NEC Corporation, Tokyo, Japan

[21] Appl. No.: 673,317

[22] Filed: Mar. 22, 1991

[30] Foreign Application Priority Data

Mar. 27, 1990 [JP] Japan .................................. 2-78125

[51] Int. Cl.[5] .............................................. G11C 13/00

[52] U.S. Cl. .......................... 365/189.05; 365/189.01; 365/189.08

[58] Field of Search ...................... 365/189.01, 189.12, 365/230.01, 185, 189.05, 189.08

[56] References Cited

U.S. PATENT DOCUMENTS 4,969,126 11/1990 Maeno ........................... 365/189.12

*Primary Examiner*—Terrell W. Fears

*Attorney, Agent, or Firm*—Leydig, Voit & Mayer

[57] ABSTRACT

A semiconductor memory device comprises a plurality of memory cells respectively storing data bits in a rewritable manner, a plurality of digit lines coupled to the memory cells, a column selector unit having a plurality of transfer gate transistors coupled between the digit lines and a data line, and a read/write controlling unit responsive to address bits and allowing one of the transfer gate transistors to couple the data line to the associated digit line, wherein the read/write controlling unit is further responsive to a bit pattern stored in a register and allows a plurality of transfer gate transistors to couple the data line to the associated digit lines so that a new data bit is concurrently written into a plurality of memory cells.

11 Claims, 4 Drawing Sheets

Fig·1
PRIOR ART

SEMICONDUCTOR MEMORY DEVICE WITH READ/WRITE CONTROLLING UNIT FOR CONCURRENTLY WRITING A DATA BIT INTO MEMORY CELLS

FIELD OF THE INVENTION

This invention relates to a semiconductor memory device and, more particularly, to a read/write controlling unit incorporated in the semiconductor memory device.

DESCRIPTION OF THE RELATED ART

A typical example of the semiconductor memory device is illustrated in FIG. 1, and comprises memory cells M11 to M1n each implemented by a series combination of a switching transistor SW and a storage capacitor STR. The switching transistors SW are concurrently gated by a word line WL, and the storage capacitors STR are coupled through the respective switching transistors SW to digit lines DL1 to DLn. Though not shown in the drawings, the word line WL is driven by a row address decoder unit. The digit lines DL1 to DLn are coupled to a column selector unit 1 which consists of a transfer gate transistors 11 to 1*n*. The column selector unit 1 is under the control of an address decoder unit 2, and one of the digit lines DL1 to DLn is coupled through the associated transfer gate transistor to a data signal line 3. The data signal line 3 is coupled at one end thereof to a write-in buffer circuit 4 and at the other end thereof to a read-out buffer circuit 5, and the write-in and read-out buffer circuits 4 and 5 are responsive to a write enable signal WE and an output enable signal OE, respectively A write-in data bit is supplied to the write-in buffer circuit 4, and a read-out data bit is fed from the read-out buffer circuit 5 to the outside thereof.

The column selector unit 2 comprises decoder circuits 2*a* and 2*b*, and AND gates 2*c* to 2*i*. The decoder circuits 2*a* and 2*b* are responsive to column address bits A0 to A3 and each drives one of the decode lines XX00 to XX11 or 00XX to 11XX. The decode lines XX00 to 11XX are selectively coupled to the AND gates 2*c* to 2*i*, respectively, and the AND gate 2*c* to 2*i* are enabled to carry out AND operation in the presence of a decode enable signal DQE.

Description is hereinbelow made on the circuit behavior on the assumption that a new data bit is written into the memory cell M11. First, the row address decoder unit drives the word line WL to a high voltage level and allows the switching transistors SW of the memory cells M11 to M1n to turn on so that the storage capacitors STR are electrically coupled to the associated digit lines DL1 to DLn, respectively. The column address bits A0 to A3 cause the decode lines XX00 and 00XX to go up to the high voltage level, however, the other decode lines XX01 to XX11 and 01XX to 11XX remain in the low voltage level. When the decode enable signal DQE goes up to the high voltage level, only the AND gate 2*c* shifts the output node thereof to the high voltage level, and the transfer gate transistor 11 turns on to provide a data path between the data line 3 and the digit line DL1. The new data bit is supplied to the write-in buffer circuit 4, and the write-in buffer circuit 4 transfers the new data bit to the data line 3 in the presence of the write-in enable signal WE. The new data bit passes through the transfer gate transistor 11, and the digit line DL1 propagates the new data bit to the memory cell M11. Since the other transfer gate transistors 12 to 1*n* remain off, the new data bit can not be transferred to the other digit lines DL2 to DLn, and is written into the memory cell M11 only.

If the data bit stored in the memory cell M11 is accessed from the outside thereof, the row address decoder unit (not shown) allows the data bits to be read out from the memory cells M11 to M1n, and the column decoder unit 2 causes the transfer gate transistor 11 to transfer the data bit from the digit line DL1 to the data line 3. The data bit thus transferred to the data line 3 is stored in the read-out buffer circuit 5 in the presence of the output enable signal OE, and the read-out data bit is supplied from the output buffer circuit 5 to the outside thereof.

A problem is encountered in the prior art semiconductor memory device in that a long time period is consumed for an initialization thereof. Namely, a new data bit is written into only one memory cell through a single write-in operation, and the write-in operation is repeated to write the same data bit into all of the memory cells M11 to M1n. Such a multiple write-in operation consumes a long time period.

SUMMARY OF THE INVENTION

It is therefore an important object of the present invention to provide a semiconductor memory device which can write a data bit into a plurality of memory cells through a single write-in operation.

To accomplish the object, the present invention proposes to store a predetermined bit pattern in a register incorporated in a column address decoder circuit for providing a plurality of data paths between a data line and digit lines.

In accordance with the present invention, there is provided a semiconductor memory device comprising: a) a plurality of memory cells respectively storing data bits in a rewriteable manner; b) a plurality of digit lines coupled to the memory cells; c) a column selector unit having a plurality of transfer gate transistors coupled between the digit lines and a data bus, the plurality of transfer gate transistors being associated with the plurality of digit lines, respectively; and d) a read/write controlling unit responsive to address bits and allowing one of the transfer gate transistors to couple the data bus to the associated digit line, the read/write controlling unit further being responsive to a predetermined bit pattern stored in a register for allowing a plurality of transfer gate transistors selected from the transfer gate transistors to couple the data bus to the associated digit lines.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
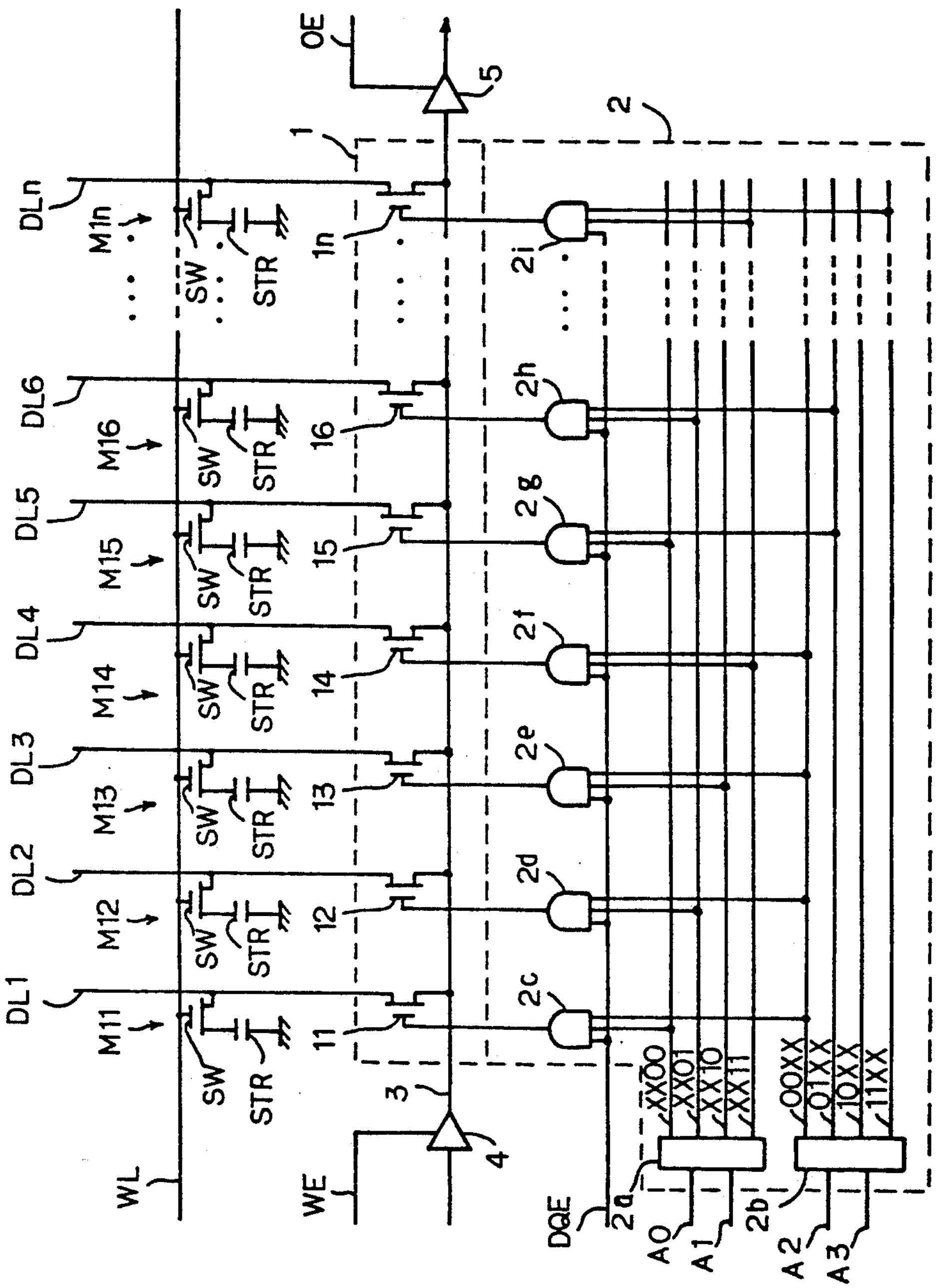
FIG. 1 is a circuit diagram showing the arrangement of a prior art semiconductor memory device.
Figure 2:
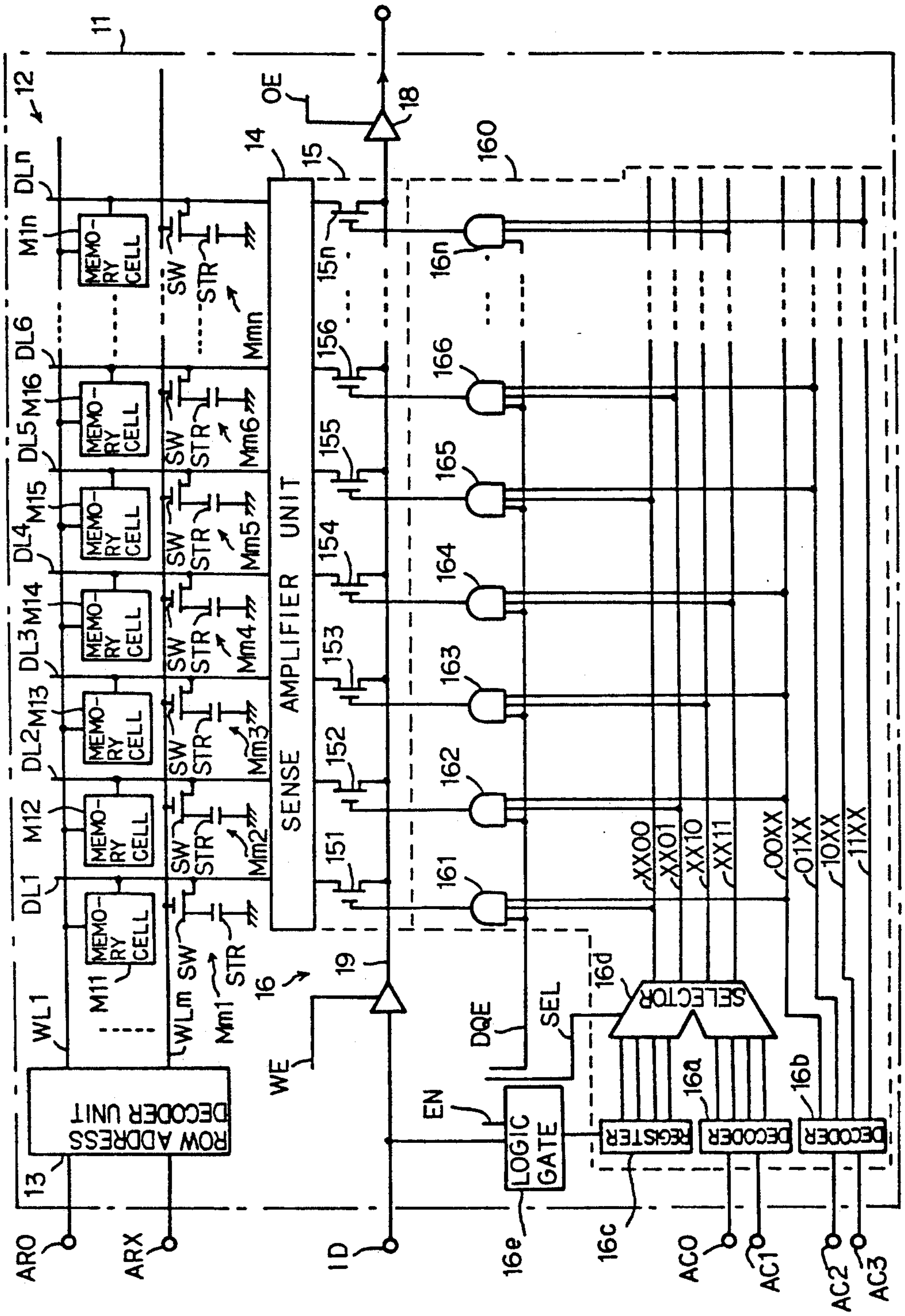
FIG. 2 is a circuit diagram showing the arrangement of a semiconductor memory device according to the present invention.

Referring first to FIG. 2 of the drawings, a semiconductor memory device embodying the present invention is fabricated on a semiconductor chip 11, and comprises a memory cell array 12, a row address decoder unit 13, a sense amplifier unit 14, a column selector unit 15, and a read/write controlling unit 16. In this instance, the read/write controlling unit comprises a column address decoder circuit 160, a write-in buffer circuit 17 and a read-out buffer circuit 18.

A memory cell array 12 is fabricated from a plurality of memory cells M.1 to M1n and Mm1 to Mmn arranged in rows and columns, and each of the memory cells M11 to Mmn has a series combination of a switching transistor SW and a storage capacitor STR. The memory cells M11 to Mmn store data bits each in the form of electric charges. In this instance, all of the switching transistors SW are of the n-channel type The memory cell array 12 is associated with a plurality of word lines WL1 to WLm and with a plurality of digit lines DL1 to DLn. Each of the word lines WL1 to WLm is coupled at the gate electrodes to the switching transistors SW of the memory cells M11 to M1n or Mm1 to Mmn in the associated row, and one of the word lines WL1 to WLm is driven to a high voltage level by the row address decoder unit 13 depending upon row address bits AR0 to ARx. The switching transistors SW of the memory cells M11 to Mm1, . . . or M1n to Mmn in each column are coupled at one of the source/drain nodes thereof to the associated digit line, and the sense amplifier unit 14 carries out difference amplification on the data bits on the digit lines DL1 to DLn. Although a precharging unit is further coupled to the digit lines DL1 to DLn, the precharging unit is not shown in the drawings for the sake of simplicity.

The digit lines DL1 to DLn are terminated at the column selector unit 15, and the column selector unit 15 is fabricated from a plurality of transfer gate transistors 151 to 15*n* of the n-channel type. The transfer gate transistors 151 to 15*n* are selectively shifted between on and off states by the column address decoder circuit 160. The column selector unit 15 is coupled to a data line 19, and the data line 19 is coupled at both ends thereof to the write-in buffer circuit 17 and the read-out buffer circuit 18. The write-in buffer circuit 17 is enabled in the presence of a write enable signal WE and temporally stores a new data bit. The read-out buffer circuit 18 is enabled in the presence of an output enable signal OE and supplies a data bit read out from a memory cell to the outside.

The column address decoder circuit 160 comprises address decoders 16*a* and 16*b*, a register 16*c*, a selector 16*d*, and AND gates 161 to 16*n*. The address decoders 16*a* and 16*b* are responsive to column address bits AC0, AC1, AC2 and AC3 and are respectively associated with two decode line groups XX00 to XX11 and 00XX to 11XX. A predetermined bit pattern of (1111) is written into the register 16*c*, and the selector 16*d* electrically couples one of the address decoder 16*a* and the register 16*c* to the decode lines XX00 to XX11 depending upon the voltage level of a selecting signal SEL. The predetermined bit pattern may be supplied from a data input terminal ID through a logic gate 16E in the presence of an enable signal EN and written into the register 16*c* in synchronism with a clock signal. The AND gates 161 to 16*n* are simultaneously enabled with a decode enable signal DQE, and the transfer gate transistors 151 to 15*n* are selectively gated by the AND gates 161 to 16*n*.

The semiconductor memory device shown in FIG. 2 behaves as follows The semiconductor memory device according to the present invention selectively enters a read-out mode of operation, a usual write-in mode of operation and a flash write mode of operation, and the flash write mode of operation allows a new data bit to be concurrently written into a plurality of memory cells. The read-out mode of operation is similar to that of the prior art semiconductor memory device, and no further description is incorporated hereinbelow for avoiding repetition.

When the selecting signal SEL is indicative of the usual write-in mode of operation, the selector 16*d* selects the address decoder 16*a* and couples the address decoder 16*a* to the decode lines XX00 to XX11. Only one of the AND gates 161 to 16*n* produces an output signal of the high voltage level in the presence decode enable signal DQE, and the associated transfer gate transistor turns on to provide a data path between the associated digit line and the data line 19. Since the row address decoder unit 13 shifted one of the word lines WL1 to WLm to the high voltage level, the associated row of the memory cells have been electrically coupled to the digit lines DL1 to DLn, respectively. The write-in buffer circuit 17 temporally stores a new data bit in the presence of the write enable signal WE and relays to the data line 19. The transfer gate transistor selected by the AND gate array 161 to 16*n* transfers the new data bit to the digit line, and the digit line 19 propagates the new data bit to the memory cell designated by the row and column address bits AR0 to ARx and AC0 to AC3. Then, the new data bit is written into the memory cell.

If the selecting signal SEL is indicative of the flash write mode, the selector 16*d* selects the register 16*c*, and electrically couples the register to the decode lines XX00 to XX11. The address decoder 16*b* is assumed to select the decode line 00XX on the basis of the column address bits AC2 and AC3. Since all of the decode lines XX00 to XX11 are driven to the high voltage level on the basis of the bit patter of (1111), the AND gates 161 to 164 concurrently Yield the output signals of the high voltage level in the presence of the decode enable signal DQE. The AND gates 161 to 164 allow the associated transfer gate transistors 151 to 154 to provide data paths between the data line 19 to the associated digit lines DL1 to DL4. A new data bit has been supplied from the write-in buffer circuit 17 to the data line 19 in the presence of the write-in enable signal WE, and the new data bit is concurrently transferred to the digit lines DL1 to DL4. The digit lines DL1 to DL4 propagate the new data bit to a row of the memory cells electrically coupled thereto, and the new data bit is concurrently written into the memory cells. If the column address bits AC2 and AC3 are sequentially changed, the new data bit is written into all of the memory cells coupled to the activated word line. However, if a bit pattern of (0000) is stored in the register 16*c*, no transfer gate transistor turns on in the presence of the selecting signal SEL.

Thus, the read/write controlling unit 16 according to the present invention allows a new data bit to be concurrently written into a plurality of memory cells, and the new data bit is distributed into the memory cells M11 to Mmn within a short time period.

In the first embodiment, the column address bits AC0 and AC1 are replaced with the predetermined bit pattern stored in the register 16c. However, n-bits of a column address signal may be replaced with $2^n$ bits in a register in another implementation, and the flash write operation is $2^n$ times faster than the prior art semiconductor memory device.

Second Embodiment

Figure 3:
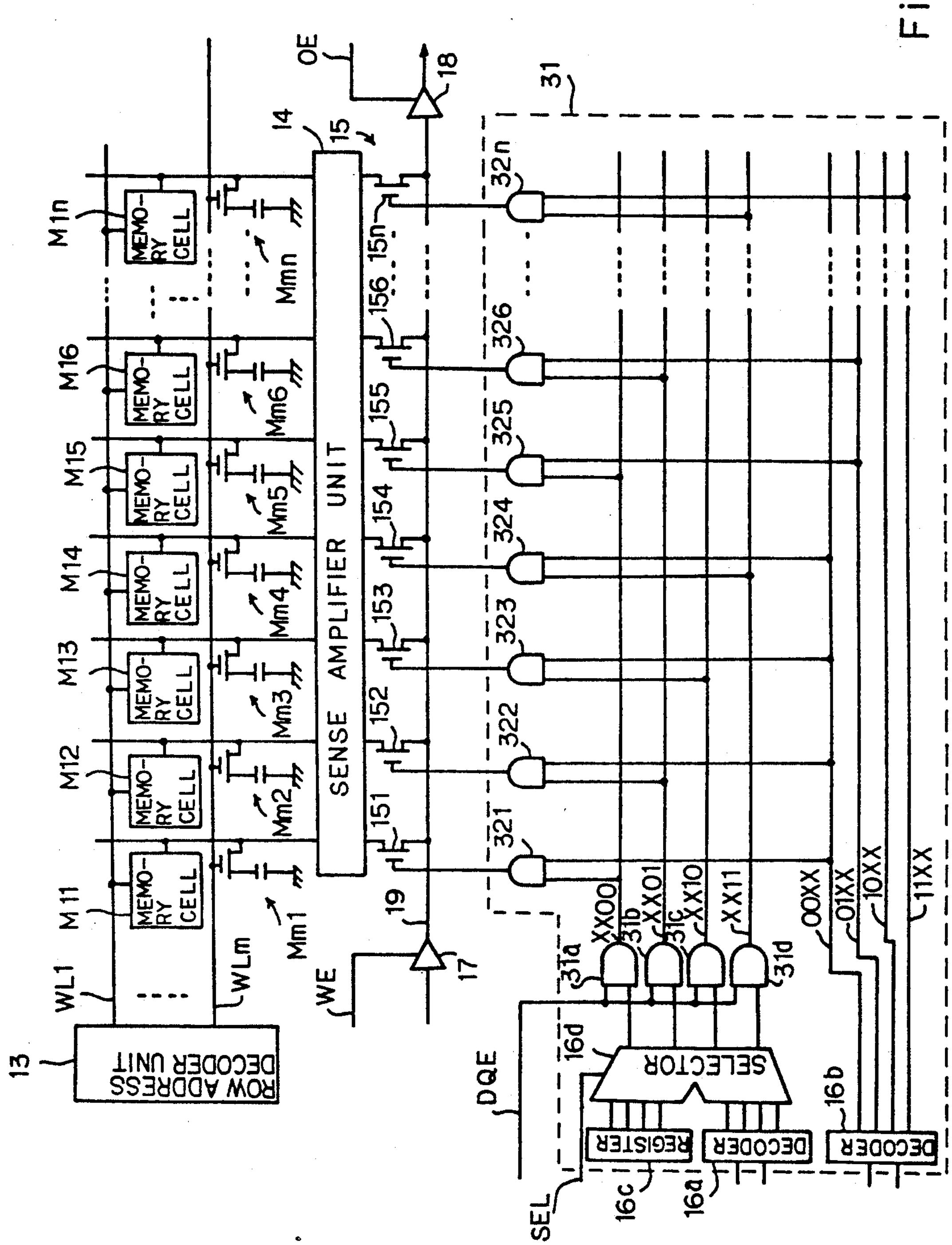
FIG. 3 is a circuit diagram showing the arrangement of another semiconductor memory device according to the present invention.

Turning to FIG. 3, another semiconductor memory device embodying the present invention is illustrated. The semiconductor memory device shown in FIG. 3 is similar in arrangement to the first embodiment except for interconnection between the AND gates 161 to 16n and the decode lines XX00 to 11XX and the enabling technique of a column address decoder circuit 31, and, for this reason, component elements of the second embodiment are designated by the same reference marks used for the corresponding elements of the first embodiment.

The column address decoder circuit 31 comprises two-input AND gates 31a to 31d coupled between the selector 16d and the decode lines XX00 to XX11, and the decode enable signal DQE is supplied to the AND gates 31a to 31d. The three-input AND gates 161 to 16n are replaced with two-input AND gates 321 to 32n, respectively. Thus, the total number of the component transistors of the two-input AND gates 31a to 31d and 321 to 32n are smaller than those of the three-input AND gates 161 to 16n, and, accordingly, the second embodiment is fabricated on a semiconductor chip smaller than the semiconductor chip 11. The circuit behaviors are similar to those of the first embodiment, and the description is omitted for the sake of simplicity.

Third Embodiment

Figure 4:
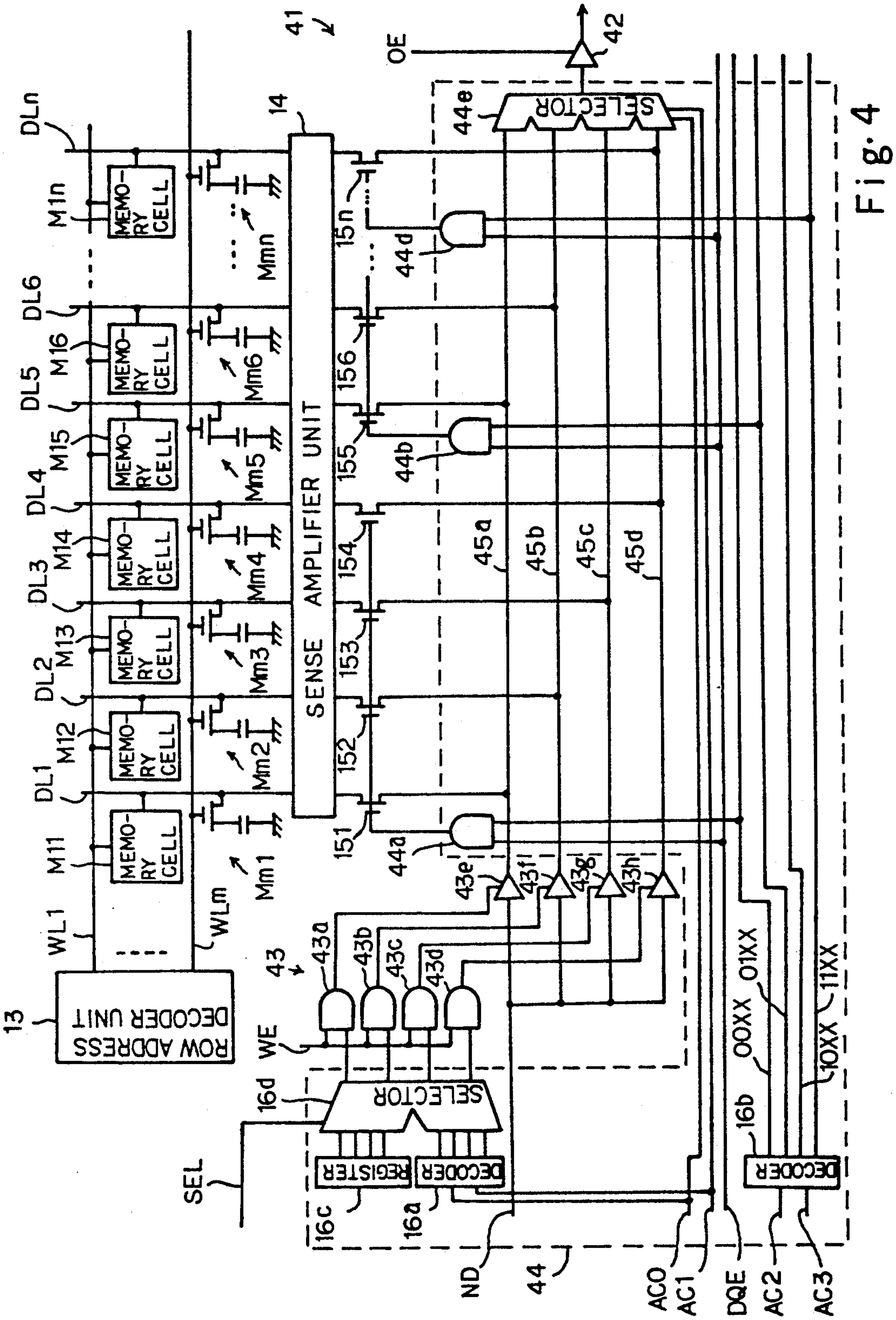
FIG. 4 is a circuit diagram showing the arrangement of still another semiconductor memory device according to the present invention.

Turning to FIG. 4, still another semiconductor memory device embodying the present invention is illustrated. The third embodiment is also similar to the first embodiment except for the arrangement of a read/write controlling unit 41, and the same reference marks are used for the corresponding component elements without any detailed description.

The read/write controlling unit 41 comprises a read-out buffer unit 42, a write-in buffer unit 43, a column address decoder unit 44, and a data bus consisting of data lines 45a to 45d. The read-out buffer unit 42 has an output data buffer 42b responsive to an output enable signal OE for delivering a read-out data bit to the outside. The write-in buffer unit 43 comprises two-input AND gates 43a to 43d responsive to the write enable signal WE, and input data buffers 43e to 43h enabled with the output signals of the two-input AND gates 43a to 43d for selectively transferring a write-in data bit ND to the data lines 45a to 45d.

The column address decoder unit 44 comprises the address decoders 16a and 16b, the register 16c, the selector 16d, two-input AND gates 44a to 44d and a selector 44e responsive to the column address bits AC2 and AC3 for selectively coupling one of the data lines 45a to 45d to the output data butter 42b. The transfer gate transistors 151 to 15n are divided into fourth groups, and the transfer gate transistors of each group are concurrently gated by the associated AND gate. Although FIG. 4 shows only three AND gates, four two-input AND gates 44a to 44d are provided in association with the four groups of the transfer gate transistors 151 to 15n, respectively.

When the semiconductor memory device enters the read-out mode of operation, the row address decoder unit 13 drives one of the word lines WL1 to WLm, and the memory cells coupled to the word line are electrically coupled to the associated digit lines DL1 to DLn. Then, the data bits are read out from the memory cells to the digit lines DL1 to DLn, and the sense amplifier unit 14 carries out difference amplification on the data bits. In the read-out mode of operation, the write enable signal WE remains in the inactive low voltage level, and the input data buffers 43e to 43h do not transfer any input data bit to the data lines 45a to 45d. One of the two-input AND gates 44a to 44d are responsive to the column address bits AC2 and AC3 in the presence of the decode enable signal DQE and shifts the output signal to the high voltage level. Then, the transfer gate transistors of the associated group concurrently turn on to provide data paths between the associated digit lines to the data lines 45a to 45d. The selector 44e is responsive to the column address bits AC0 and AC1 and relays the data bit on one of the data lines 45a to 45d to the output data buffer 42b.

If the semiconductor memory device enters the usual write-in mode of operation, the selecting signal SEL electrically couples the address decoder 16a to the AND gates 43a to 43d, and the write enable signal WE activates the AND gates 43a to 43d. Then, a new data bit is relayed through one of the input data buffers 43e to 43h to the associated data line depending upon the column address bits AC0 and AC1. The column address bits AC2 and AC3 allow one of the AND gates 44a to 44d to yield the output signal of the high voltage level, and the transfer gate transistors of the associated group concurrently turn on to provide the data paths. However, since only one data line propagates the new data bit, the new data bit is transferred through one of the data paths to the associated digit line. Then, the new data bit is written into one of the memory cells contained in one of the rows coupled to the activated word line.

If the semiconductor memory device enters the flash write mode of operation, the selecting signal SEL causes the selector 16d to be transparent to the predetermined bit pattern of (1111) fed from the register 16c, and the write enable signal WE activates all of the AND gates 43a to 43d. Then, all of the AND gates 43a to 43d produce the output signals of the high voltage level, and allow the input data buffers 43e to 43h to relay the new data bit to the associated data lines 45a to 45d. The column address bits AC2 and AC3 allow one of the AND gates 44a to 44d to produce the output signal of the high voltage level in the presence of the decode enable signal DQE, and the AND gate thus producing the output signal of the high voltage level allow the transfer gate transistors of the associated group to turn on. Then, the new data bit on the data lines 45a to 45d are concurrently transferred through the transfer gate transistors to the digit lines and is written into the memory cells designated by the word line. If the column address bits AC2 and AC3 are sequentially changed, the new data bit is written into all of the memory cells coupled to the selected word line.

Since all of the AND gates 43a to 43d and 44a to 44d are of the two-input type, the number of the component transistors are small as similar to the second embodiment. Moreover, the input data buffers 43e to 43h are provided in association with the data lines 45a to 45d, respectively, and, for this reason, each of the input data buffers 43e to 43h is smaller in current driving capability than the write-in buffer circuit 17. This makes the design work easy rather than the first embodiment.

Although particular embodiments of the present invention have been shown and described, it will be obvious to those skilled in the art that various changes and modifications may be made without departing from the spirit and scope of the present invention. For example, a bit pattern may be fixedly stored in the register 16c through a fabrication process of the semiconductor memory device.

What is claimed is:

1. A semiconductor memory device comprising:

a) a plurality of memory cells respectively storing data bits in a rewritable manner;

b) a plurality of digit lines coupled to said memory cells;

c) a column selector unit having a plurality of transfer gate transistors coupled between said digit lines and a data bus, said plurality of transfer gate transistors being associated with said plurality of digit lines, respectively; and d) a read/write controlling unit having a register and being responsive to address bits for allowing one of said transfer gate transistors to couple said data bus to the associated digit line, said read/write controlling unit further being responsive to a predetermined bit pattern stored in said register for allowing a plurality of transfer gate transistors selected from said transfer gate transistors to couple said data bus to the associated digit lines.

2. A semiconductor memory device as set forth in claim 1, in which said read/write controlling unit comprises a write-in buffer circuit coupled to said data bus, first and second address decoders supplied with column address bits, a selector responsive to a selecting signal and becoming transparent to one of said first address decoder and said register, first decode lines coupled to said selector, second decode lines coupled to said second address decoder, and a plurality of logic gates selectively coupled to said first and second decode lines and selectively gating said transfer gate transistors, and in which each of said second decode lines is coupled to a plurality of logic gates selected from said plurality of logic gates.

3. A semiconductor memory device as set forth in claim 2, in which said predetermined bit pattern consists of logic "1" bits, and in which said logic gates are formed by three-input AND gates supplied with a decode enabling signal.

4. A semiconductor memory device as set forth in claim 1, in which said read/write controlling circuit comprises a write-in buffer circuit coupled to said data bus, third and fourth address decoders supplied with column address bits, a selector responsive to a selecting signal and becoming transparent to one of said third address decoder and said register, third decode lines associated with said selector, fourth decode lines coupled to said fourth address decoder, and a plurality of first logic gates responsive to a decode enable signal and coupled between said selector and said third decode lines, respectively, a plurality of second logic gates selectively coupled to said third and fourth decode lines and selectively gating said transfer gate transistors, and in which each of said fourth decode lines is coupled to a plurality of second logic gates selected from said plurality of second logic gates.

5. A semiconductor memory device as set forth in claim 4, in which said first and second logic gates are formed by two-input AND gates.

6. A semiconductor memory device as set forth in claim 1, in which said read/write controlling unit comprises a write-in buffer unit, a read-out buffer unit and a column address decoder unit.

7. A semiconductor memory device as set forth in claim 6, in which said transfer gate transistors are divided into groups, and in which said column address decoder unit comprises fifth and sixth address decoders supplied with column address bits, a first selector responsive to a selecting signal and becoming transparent to one of said fifth address decoder and said register, a plurality of third logic gates responsive to a decode enable signal and selectively allowing said transfer gate transistors of one of said groups depending upon said column address bits fed to the sixth address decoder, and a second selector coupled between said data bus and said read-out buffer unit and transferring one of said data bits fed from said memory cells to said read-out buffer unit depending upon said column address bits fed to said fifth address decoder.

8. A semiconductor memory device as set forth in claim 7, in which said write-in buffer unit comprises a plurality of fourth logic gates responsive to a write enable signal and coupled to said first selector, and a plurality of input data buffers respectively enable by said fourth logic gates and selectively transferring a write-in data bit to said data bus.

9. A semiconductor memory device as set forth in claim 8, in which said third and fourth logic gates are formed by two-input AND gates.

10. A semiconductor memory device comprising:

a) a plurality of memory cells arranged in rows and columns and respectively storing data bits in a rewritable manner;

b) a plurality of word lines coupled to the rows of said memory cells, respectively;

c) a row address decoder unit responsive to row address bits and driving one of said word lines for allowing said data bits to be read out from said memory cells coupled to said one of said word lines;

d) a plurality of digit lines coupled to the columns of said memory cells;

e) a column selector unit having a plurality of transfer gate transistors coupled between said digit lines and a data bus, said plurality of transfer gate transistors being associated with said plurality of digit lines, respectively; and f) a read/write controlling having a register and being responsive to column address bits for allowing one of said transfer gate transistors to couple said data bus to the associated digit line, said read/-write controlling unit further being responsive to a bit patters stored in said register for allowing a plurality of transfer gate transistors selected from said transfer gate transistors to couple said data bus to the associated digit lines.

11. A semiconductor memory device as set forth in claim 10, in which said read/write controlling unit comprises a write-in buffer circuit coupled to said data bus, first and second address decoders supplied with column address bits, a selector responsive to a selecting signal and becoming transparent to one of said first address decoder and said register, first decode lines coupled to said selector, second decode lines coupled to said second address decoder, and a plurality of logic gates selectively coupled to said first and second decode lines and selectively gating said transfer gate transistors, and in which each of said second decode lines is coupled to a plurality of logic gates selected from said plurality of logic gates.

* * * * *